United States Patent
Sommerfeld et al.

(10) Patent No.: US 6,362,546 B1
(45) Date of Patent: Mar. 26, 2002

(54) RECTIFIER DEVICE FOR A DYNAMO OF A MOTOR VEHICLE

(75) Inventors: Peter Sommerfeld, Krefeld (DE); Johannes A. Rebergen, Venlo (NL); Volker Thor, Essen (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/670,133

(22) Filed: Sep. 26, 2000

(30) Foreign Application Priority Data

Sep. 27, 1999 (DE) .......................... 199 46 255

(51) Int. Cl.[7] .............................................. H02K 11/00
(52) U.S. Cl. ........................................ 310/68 D; 310/58
(58) Field of Search .................................. 363/141, 144, 363/145; 310/68 D, 58

(56) References Cited

U.S. PATENT DOCUMENTS 5,006,741 A * 4/1991 Schott ........................ 310/68 D
5,317,224 A * 5/1994 Ragaly ........................ 310/58

* cited by examiner

*Primary Examiner*—Shawn Riley
(74) *Attorney, Agent, or Firm*—Ernestine C. Bartlett; Norman N. Spain

(57) ABSTRACT

A rectifier device with at least one cooling body), with at least one diode arranged on the cooling body, with at least one protective layer is arranged on the diode and the cooling body, and with at least one receptacle at the cooling body for connection to the protective layer.

1 Claim, 1 Drawing Sheet

RECTIFIER DEVICE FOR A DYNAMO OF A MOTOR VEHICLE

BACKGROUND OF THE INVENTION

The invention relates to a rectifier device for a three-phase dynamo of a motor vehicle. Three equal, mutually independent windings u, v, w, spatially staggered by 120° each time, are present according to the classic principle of the three-phase dynamo (stator). The exciter winding is present on the rotary part in the interior (rotor). The moment an exciter current flows through the windings, a magnetic field will arise which in its turn will induce a three-phase AC voltage in the stator windings which supplies the three-phase current when a load is connected. This current is rectified by means of a bridge rectifier circuit and serves to supply the load and to charge the battery. The output voltage of the dynamo is controlled by means of a controller (pulse width modulation of the exciter current: PWM), i.e. the average value of the exciter current is adjusted in dependence on the instantaneous available battery voltage.

Known electrical rectifier arrangements for motor vehicle applications are built up with diodes in special housings, which diodes are mechanically pressed in into metal cooling plates (so-called press-fit diodes) or are soldered onto cooling plates. The construction of the electrical and thermal connection between the diodes and a cooling body (usually a cooling plate which also serves as the component carrier) is of special importance because the power losses in the components in question are to be removed with sufficient speed on account of the high electric current values (typically approximately 50 A to 130 A). The mechanical connection of the (usually eight) diodes to one another and the electrical connections are usually formed by a pressed metal screen molded around with synthetic resin.

A very good thermal connection of the diodes to the cooling plate can be achieved through soldering. Diodes in housings are surrounded by a plasticized synthetic resin which is decomposed above a certain temperature. To comply with the requirements set by the high operating temperature of a rectifier, a soft solder with a higher melting temperature is to be used for the connection. The melting point of the solders suitable for this lies above the decomposition temperature of the synthetic resin of the encapsulated diodes. This means that diodes in housings can only be used for rectifiers when the requirements are reduced. Known rectifier arrangements accordingly show no encapsulation and anchoring of the rectifier diodes.

SUMMARY OF THE INVENTION

It is accordingly an object of the invention to provide a rectifier device for three-phase dynamos for motor vehicles which offers the diodes a better protection.

This object is achieved by means of a rectifier device with at least one cooling body, with at least one diode arranged on a cooling body, with at least one protective layer arranged on the diode and on the cooling body, and with at least one receptacle at the cooling body for connection to the protective layer. The rectifier device according to the invention renders possible the use of diode chips without housings which are not surrounded with synthetic resin until after soldering. The synthetic resin of the housing thus is not subjected to a treatment which lies above its decomposition temperature. The receptacle at the cooling body may be formed, for example, by a depression with an undercut. However, many fastening possibilities are conceivable which offer a simple and permanent connection or adhesion between the protective layer and the cooling body. The aspect of thermal loading is to be given special attention here. A rectifier arrangement according to the invention utilizes the cooling plate of the rectifier as a constructional part for the diode housing. The diodes are soldered on the cooling plates and encapsulated thereon afterwards. The thermal interconnection is thus optimized and the number of solder spots is reduced to a minimum. This enhances the reliability and useful life of the rectifier. The constructional incorporation of the semiconductor diodes of the rectifier into the total construction is the major feature of the invention. In general, however, the invention may be utilized for all applications with power semiconductors.

An embodiment of the invention will now be explained in more detail below with reference to drawings, in which

BRIEF DESCRIPTION OF THE DRAWING

An embodiment of the invention will now be explained in more detail below with reference to the drawings.

DETAILED DESCRIPTION OF THE INVENTION

Figure 1:
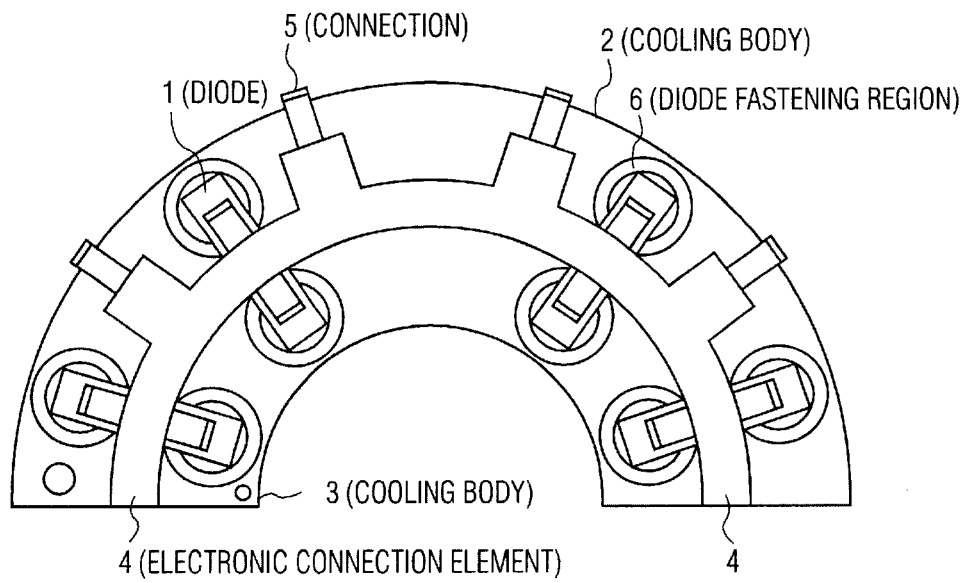
FIG. 1 is a diagrammatic view of a rectifier device with diodes on two cooling bodies.

In the drawing: FIG. 1 shows the construction of a rectifier device with diodes 1 on two cooling bodies 2 and 3. The rectifier device consists of two cooling plates 2 and 3 each with the same number of diodes 1 which are contacted by means of an electric connection element 4 which forms several connections 5. The connections 5 of the connection element 4 to the diodes 1 may be welded, soldered, or be constructed as pressure contacts. The cooling plates 2 and 3 are structured in the diode fastening regions 6 such that the encapsulation can anchor itself mechanically. A protection of the entire diode assembly against mechanical stresses in the case of temperature fluctuations is obtained in this manner.

Figure 2:
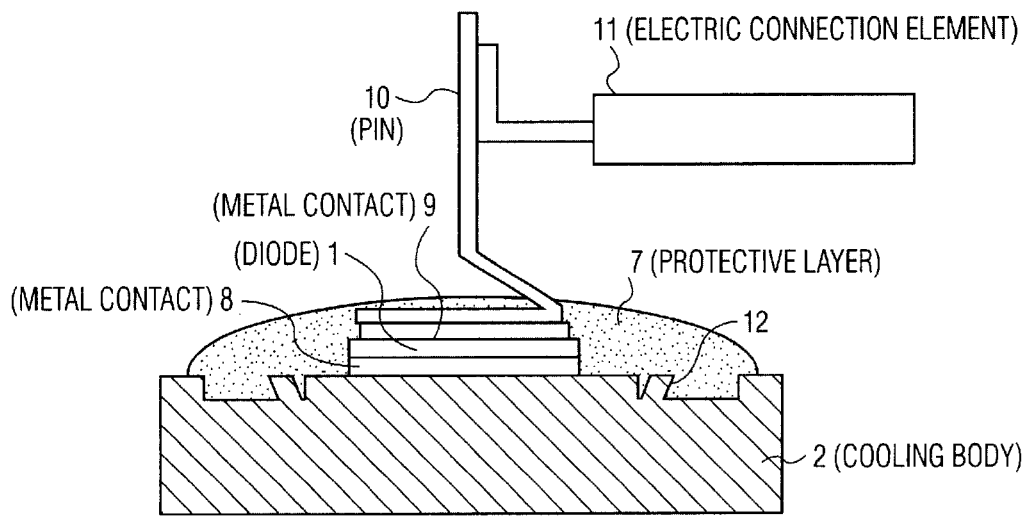
FIG. 2 is a diagrammatic cross-sectional view of a diode with a protective layer fastened on a cooling body

A detailed view of a diode 1 with a protective layer 7 fastened on a cooling body 2 is shown in cross-section in FIG. 2. The semiconductor chip 1 is soldered between two metal connections 8 and 9 (for example made of copper) which form the upper and lower contact surfaces. The lower contact 8 is soldered on the cooling plate 2, possibly metallized on the upper surface, over its entire surface area. The upper contact 9 has a surface which is adapted to the diode metallization in the case of diodes with mesa structures, thus preventing the occurrence of short-circuits. A pin 10 may be soldered to the upper contact 9, thus providing the contact to the electrical connection element 11. The cooling plate 2 has a structure around the region where the diode 1 is connected. This structure should comprise receptacles 12 such as depressions, possibly with undercuts, which are to serve as retention means for an encapsulation 7. This structure may be manufactured by means of various stamping, pressing, and deep-drawing methods. The diode 1 is surrounded by a curable synthetic resin 7 which also flows into the undercuts, anchoring itself there after curing. This molded synthetic resin 7 provides a relaxation of mechanical stresses of all soldered spots present in the construction by means of an omnidirectional pressure (caused by cooling-down after curing at elevated temperature), because it applies itself directly to the cooling plate 2. Additionally, it protects the diode 1 against external influences.

What is claimed is:

1. A rectifier device for a three-phase dynamo of a motor vehicle with at least one cooling body (2), with at least one diode (1) arranged on a cooling body (2), with at least one protective layer (7) provided on the diode (1) and on the cooling body (2), and with at least one receptacle (12) at the cooling body (2) connecting the cooling body (2) to the protective layer (7).

* * * * *